United States Patent
Yu et al.

(10) Patent No.: US 10,931,229 B2
(45) Date of Patent: Feb. 23, 2021

(54) SOLAR CELL TESTING SYSTEM AND TESTING METHOD THEREOF

(71) Applicant: INDUSTRIAL TECHNOLOGY RESEARCH INSTITUTE, Hsinchu (TW)

(72) Inventors: Li-Chieh Yu, Taipei (TW); Wei-Lun Yang, Hsinchu (TW); Yu-Tai Li, Taichung (TW); Kuan-Wu Lu, Hsinchu (TW); Cho-Fan Hsieh, Luodong Township (TW); Ching-Chiao Tsai, Hsinchu (TW); San-Yu Ting, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 119 days.

(21) Appl. No.: 16/219,684

(22) Filed: Dec. 13, 2018

(65) Prior Publication Data

US 2020/0195194 A1    Jun. 18, 2020

(51) Int. Cl.
*H02S 50/10* (2014.01)
*H01L 31/048* (2014.01)
*H01L 31/0224* (2006.01)

(52) U.S. Cl.
CPC ...... *H02S 50/10* (2014.12); *H01L 31/022425* (2013.01); *H01L 31/0481* (2013.01)

(58) Field of Classification Search
None
See application file for complete search history.

(56) References Cited

U.S. PATENT DOCUMENTS

| 9,506,975 B2 | 11/2016 | Nagel |
| 9,598,586 B2 | 3/2017 | Brophy et al. |
| 9,680,412 B2 | 6/2017 | Stoicescu et al. |

(Continued)

FOREIGN PATENT DOCUMENTS

| CN | 103904993 B | 4/2016 |
| CN | 106208964 B | 1/2018 |

(Continued)

OTHER PUBLICATIONS

Taiwanese Office Action and Search Report, dated Aug. 14, 2019, for Taiwanese Application No. 108100036.

(Continued)

*Primary Examiner* — Paresh Patel
(74) *Attorney, Agent, or Firm* — Birch, Stewart, Kolasch & Birch, LLP

(57) ABSTRACT

A solar cell testing system including a lower electrode, a solar cell, an encapsulation material, a sodium-containing template, an upper electrode, a voltage source and a measuring circuit is provided. The solar cell is disposed on the lower electrode. The encapsulation material is disposed on the solar cell. The sodium-containing template is disposed on the encapsulation material, wherein the sodium-containing template has a sodium ion content ranging between 9-39%. The upper electrode is disposed on the sodium-containing template. The voltage source is connected between the upper electrode and the lower electrode. The measuring circuit is connected between the solar cell and the lower electrode for measuring a shunt resistance of the solar cell.

12 Claims, 3 Drawing Sheets

(56) References Cited

U.S. PATENT DOCUMENTS

2013/0255745 A1* 10/2013 Doech ............... H01L 31/02167
                                                          136/244
2014/0132302 A1   5/2014 Nagel
2014/0340110 A1  11/2014 Jiang et al.
2017/0058133 A1*  3/2017 Niboshi .................. C23C 16/30

FOREIGN PATENT DOCUMENTS

| CN | 106656041 B | 5/2018 |
|---|---|---|
| TW | 201422556 A | 6/2014 |
| TW | 201422695 A | 6/2014 |
| TW | 201424014 A | 6/2014 |
| TW | 201441353 A | 11/2014 |

OTHER PUBLICATIONS

Gielen et al., "Letting in the Light, How solar photovoltaics will revolutionise the electricity system" IRENA, 2016, 52 pages.
Hacke et al., "Survey of potential-induced degradation in thin-film modules" Journey of Photonics for Energy, 2015, vol. 5, 15 pages.
Luo et al., "Potential-induced degradation in photovoltaic modules: a critical review", Energy & Environmental Science, 2017, 10, pp. 43-68.

\* cited by examiner

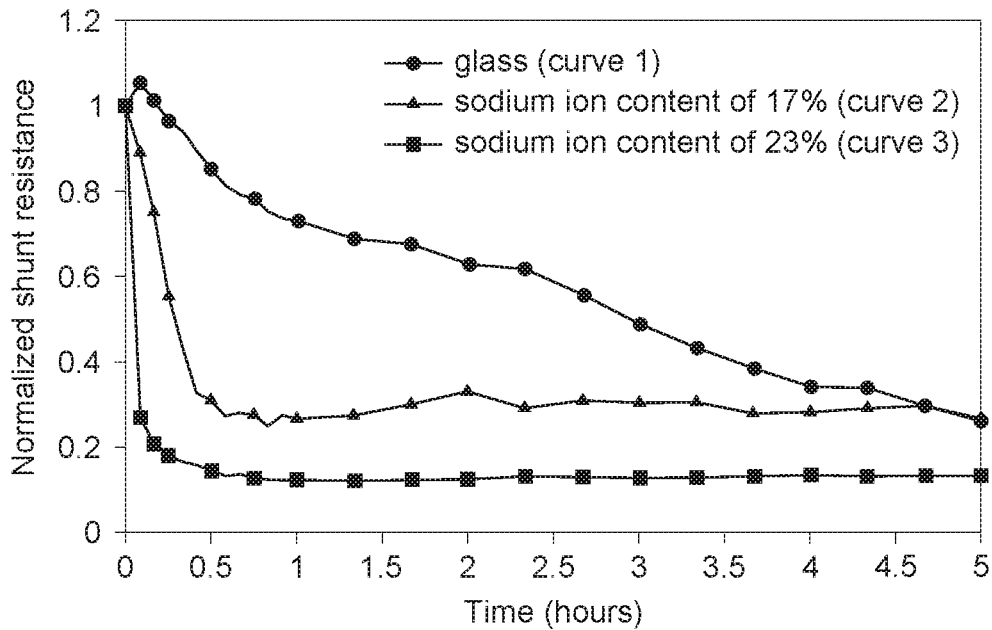

FIG. 4

| Provide a module-like sample between a lower electrode and an upper electrode, wherein the module-like sample includes a solar cell, a packaging material, and a sodium-containing template having a sodium ion content ranging between 9-39% | S11 |

| Apply an operating voltage to the upper electrode and the lower electrode by a voltage source to perform a potential induced degradation (PID) test on the module-like sample | S12 |

| Measure a shunt resistance of the solar cell by a measuring circuit connected between the solar cell and the lower electrode | S13 |

FIG. 5

SOLAR CELL TESTING SYSTEM AND TESTING METHOD THEREOF

TECHNICAL FIELD

The disclosure relates in general to a solar cell testing system and a testing method thereof.

BACKGROUND

As the energy issue is getting more and more valued and the solar technology is getting more and more matured, the solar cell capable of converting solar light into electricity through photoelectric conversion has been widely used in the generation of solar energy.

The photovoltaic module is used in an outdoor environment. Due to the architecture of the circuit system, the photovoltaic module used under system voltage will generate potential induced degradation (PID) over a long period of use, and the power generation efficiency of the cell will therefore attenuate.

The PID-resistance test is for testing to which degree the high potential between the cell and the frame of the solar panel accelerates the degradation of the solar panel. Currently, PID-resistance test has many verification methods. The first verification method verifies the entire module through an environmental chamber that matches the outdoor environment. However, such verification method, which requires expensive detection equipment and takes a long testing time, is unfavorable in terms of cell material detection and development of the solar photovoltaic module. The second verification method, which simulates and verifies the cell material and encapsulation material of the classical module, effectively reduces testing cost and testing time. However, the verification rate of such verification method is limited by the simulation purpose of the classical module sample which means the combination materials need to be the same as that of the solar photovoltaic module sample.

Therefore, it has become a prominent task for the industries to find which factors dominate potential induced degradation of the cell and immediately determine how these factors affect potential induced degradation of the cell.

SUMMARY

The present disclosure relates to a solar cell testing system including a sodium-containing template having adjustable sodium ion contents and a measuring circuit capable of measuring the resistance of solar cell. The solar cell testing system tests how different sodium ion contents affect the solar cell.

According to an embodiment of the present disclosure, a solar cell testing system is provided. The solar cell testing system includes a lower electrode, a solar cell, an encapsulation material, a sodium-containing template, an upper electrode, a voltage source, and a measuring circuit. The solar cell is disposed on the lower electrode. The encapsulation material is disposed on the solar cell. The sodium-containing template is disposed on the encapsulation material, wherein the sodium-containing template has a sodium ion content ranging between 9-39%. The upper electrode is disposed on the sodium-containing template. The voltage source is connected between the upper electrode and the lower electrode. The measuring circuit is connected between the solar cell and the lower electrode for measuring a shunt resistance of the solar cell.

According to another embodiment of the present disclosure, a solar cell testing method is provided. The solar cell testing method includes the following steps. A module-like sample is provided between a lower electrode and an upper electrode, wherein the module-like sample includes a solar cell, an encapsulation material, and a sodium-containing template having a sodium ion content ranging between 9-39%. An operating voltage is applied to the upper electrode and the lower electrode by a voltage source to perform a potential induced degradation (PID) test on the module-like sample. A shunt resistance of the solar cell is measured by a measuring circuit connected between the solar cell and the lower electrode.

The above and other aspects of the disclosure will become understood with regard to the following detailed description of the preferred but non-limiting embodiment(s). The following description is made with reference to the accompanying drawings.

BRIEF DESCRIPTION OF THE DRAWINGS

FIG. 4 is a shunt resistance vs time relationship chart obtained from the PID-resistance test performed on the templates having different sodium ion contents.

FIG. 5 is a flowchart of a solar cell testing method according to an embodiment of the present disclosure.

DETAILED DESCRIPTION

Detailed descriptions of the disclosure are disclosed below with a number of embodiments. However, the disclosed embodiments are for explanatory and exemplary purposes only, not for limiting the scope of protection of the disclosure. Similar/identical designations are used to indicate similar/identical elements. Directional terms such as above, under, left, right, front or back are used in the following embodiments to indicate the directions of the accompanying drawings, not for limiting the present disclosure.

Figure 1:
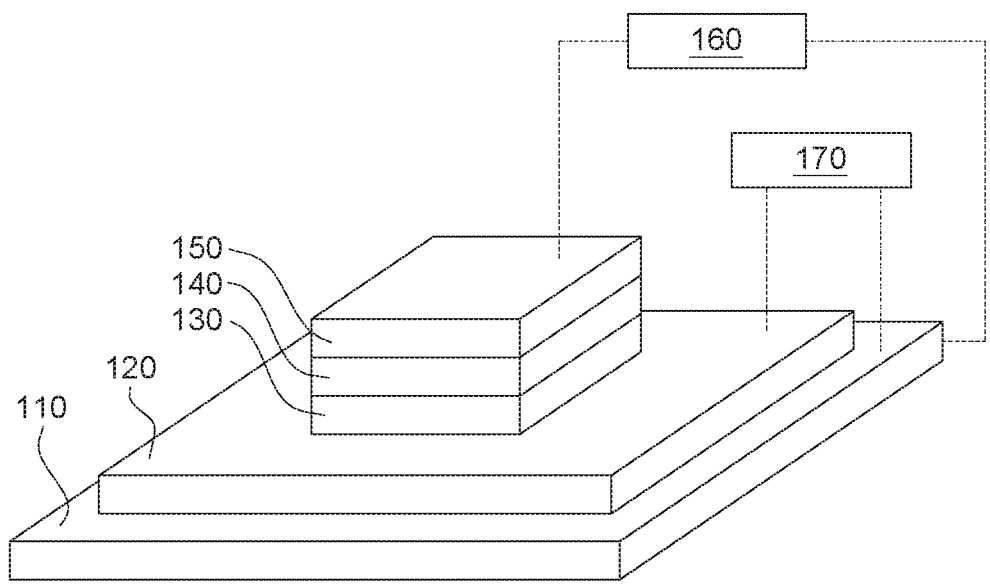
FIG. 1 is a schematic diagram of a solar cell testing system according to an embodiment of the present disclosure.

According to an embodiment of the present disclosure, a solar cell testing system is provided. The solar cell testing system can be used in an anti-potential induced degradation test system or other system to test how different sodium ion contents affect the solar cell. Refer to FIG. 1. The solar cell testing system 100 includes a lower electrode 110, a solar cell 120, an encapsulation material 130, a sodium-containing template 140, an upper electrode 150, a voltage source 160, and a measuring circuit 170. The solar cell 120 is disposed on the lower electrode 110. The encapsulation material 130 is disposed on the solar cell 120. The sodium-containing template 140 is disposed on the encapsulation material 130, wherein the sodium-containing template 140 has a sodium ion content ranging between 9-39%. The upper electrode 150 is disposed on the sodium-containing template 140. The voltage source 160 is connected between the upper electrode 150 and the lower electrode 110. The measuring circuit 170 is connected between the solar cell 120 and the lower electrode 110 for measuring a shunt resistance of the solar cell 120.

Refer to FIG. 1. In an embodiment, the lower electrode 110 can be made by such as an aluminum electrode or a copper electrode, and the upper electrode 150 can be made by a metal block such as a copper block or an aluminum block. The voltage source 160 is connected between the lower electrode 110 and the upper electrode 150 for providing an operating voltage and an operating current. The operating voltage is +1000 volts or −1000 volts.

Besides, the solar cell 120, the encapsulation material 130, and the sodium-containing template 140 can be stacked together to form a module-like sample for performing a PID test to simulate how different sodium ion contents affect the solar cell in a high voltage environment.

Refer to FIGS. 1, 2 and 3A-3C. In an embodiment, the upper electrode 150 is connected to the positive polarity of the voltage source 160, and the lower electrode 110 is connected to the negative polarity or the ground end of the voltage source 160, such that the sodium ions can be continuously driven to be migrated to the solar cell 120. When measuring the shunt resistance, the voltage source 160 is switched to the voltage source of the measuring circuit 170, such that the solar cell 120 is in a reverse bias and the shunt resistance of the solar cell 120 can be measured after a period of time. Since the sodium ions 142 of the sodium-containing template 140 are biased, the sodium ions 142 generate electromigration and are moved to the solar cell 120 to form an open circuit, through which a part of the electrons are shunted to the lower electrode 110. Thus, the measuring circuit 170 can measure the change in the shunt resistance of the solar cell 120 caused by the electromigration of the sodium ions 142.

Figure 2:
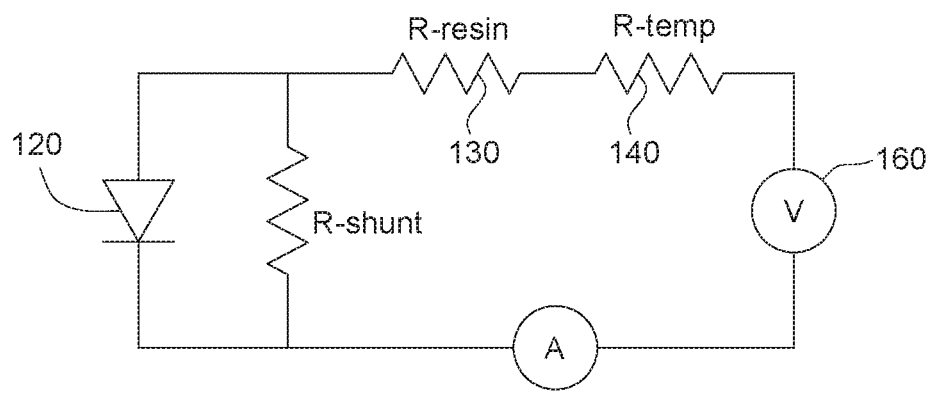
FIG. 2 is a circuit diagram of resistance measurement of a solar cell.

Refer to FIG. 2. The solar cell 120 is designated by a diode symbol, the resistance of the encapsulation material 130 is designated by R-resin, the resistance of the sodium-containing template 140 is designated by R-temp, and the shunt resistance is designated by R-shunt. Given that the initial shunt resistance of the solar cell 120 is known, such as 500 Ohms, the shunt resistance R-shunt of the solar cell 120 in a PID test can be obtained by applying a reverse bias to solar cell 120 then further divided by obtained current.

As indicated in FIG. 1, the measuring circuit 170 is connected between the solar cell 120 and the lower electrode 110 for measuring a shunt resistance of the solar cell 120.

Experimental results show that the sodium ion content of the sodium-containing template 140 is the main reason for inducing the PID of the cell. When the sodium ion content increases, the degradation speed of the shunt resistance increases, the PID speed of the cell also increases. Therefore, in the present embodiment, the detection rate of the solar cell testing system 100 can be increased through the use of the sodium-containing templates 140 having adjustable sodium ion contents and the measuring circuit 170 capable of measuring the shunt resistance of the solar cell 120.

Figure 3A:
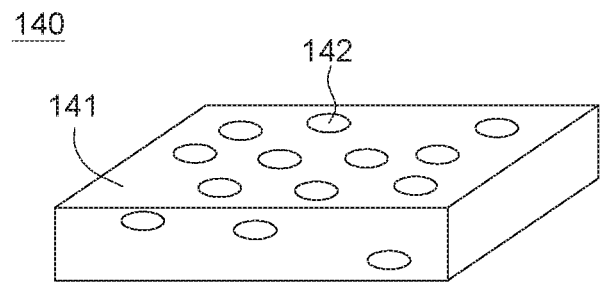
FIGS. 3A-3C are schematic diagrams of three sodium-containing templates.
Figure 3B:
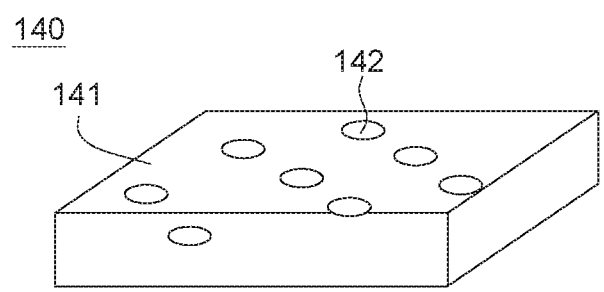
Figure 3C:
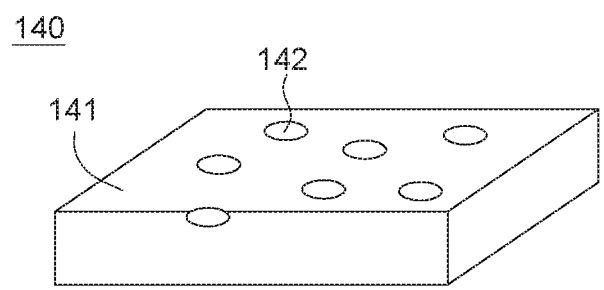

Refer to FIGS. 3A-3C. In an embodiment, the sodium-containing template 140 contains a polymer resin material 141 and a compound (such as sodium chloride) containing sodium ions 142, wherein the sodium content Wt is obtained as follows: a product is obtained by multiplying the weight W1 of the sodium-containing compound by a weight percentage q %, to which the sodium ions are contained in the sodium-containing compound, then the product is divided by the total weight of the sodium-containing template 140 (the sum of the weight W2 of the resin and the weight W1 of the sodium-containing compound), that is, Wt=(W1*q %)/(W2+W1).

The sodium-containing template 140 may include multiple templates such as three or more than three templates. Each template has a different content of sodium ions 142. In the present embodiment, the content range of sodium ions 142 is exemplified by 9-39%. For example, the content of the sodium ions 142 contained in the sodium-containing template 140 may have three or more than three ranges, that is, 9-13%, 13-23%, 23-39% or other suitable range in the analysis of how different content of the sodium ions 142 contained in the sodium-containing template 140 affects the PID of the cell.

Refer to FIGS. 3A-3C. The contents of sodium ions 142 of the three sodium-containing templates 140 are between 23-39%, 13-23%, and 9-13%, respectively. In the present embodiment, other types of metal ions apart from the sodium ions 142 are used in the PID test. For example, the sodium-containing template 140 can be replaced by the template containing copper ions, silver ions or magnesium ions, and the present disclosure is not limited thereto.

Moreover, the encapsulation material 130 can be formed by such as ethylene vinyl acetate (EVA), silicone material, ethylene/methacrylate, polybutyl acrylate, or aliphatic polyurethane. The encapsulation material 130 has a thickness between 0.4-0.6 mm or 0.8-1.0 mm. At the normal temperature, the EVA film is non-sticky and has an anti-stick feature. The EVA film, which generates fusion bonding and adhesive curing after having been hot pressed under certain conditions during the packing process of the solar cell, is a thermosetting hot melt film. After having been cured, the EVA film becomes completely transparent and has a high light transmittance. The cured EVA can resist the atmospheric change and has elasticity, and can glue to the solar cell completely.

Furthermore, the resin material 141 used in the sodium-containing template 140 can be formed by a thermosetting or thermoplastic resin such as epoxy or ethylene vinyl acetate. The resin material 141 has a high transmittance of light and can replace the glass used in the conventional PID test to simulate the state of the solar cell 120 during packaging. The advantage of replacing glass by the resin material 141 is that the content of sodium ions 142 in the resin material 141 can be adjusted. The verification of the conventional glass whose content of sodium ions 142 is below 6% takes a longer time, and the detection rate of the PID test cannot be effectively increased. Conversely, in the present embodiment, the content of sodium ions 142 in the adjustable sodium-containing template 140 is increased, and the detection rate of the PID test can therefore be effectively increased. In an embodiment, the resin material 141 of the sodium-containing template 140 can be the same as the encapsulation material 130, such that the sodium-containing template 140 and the encapsulation material 130 can be integrated into one.

Refer to FIG. 4, a shunt resistance vs time relationship chart obtained from the PID test performed on the templates having different sodium ion contents is shown. Curves 1, 2 and 3 of FIG. 4 are respectively plotted according to the results of the PID test performed on the sodium-containing template 140 formed of glass, the sodium-containing template 140 having a sodium ion content of 17%, and the sodium-containing template 140 having a sodium ion content of 23%. Curves 1, 2 and 3 respectively show that it takes 5 hours, 30 minutes and 10 minutes for the degradation of shunt resistance to reach 70%, 70%, and 80%. The results show that the sodium-containing template 140 having a sodium ion content of 23% can best accelerate the detection rate in the PID test.

According to an embodiment of the present disclosure, a solar cell testing method, such as a solar cell anti-potential induced degradation testing method or other testing method is provided. Refer to FIGS. 1 and 5. The solar cell testing method includes steps S11-S13. In step S11, a module-like sample to be tested is provided between a lower electrode 110 and an upper electrode 150, wherein the module-like sample includes a solar cell 120, an encapsulation material 130 and a sodium-containing template 140 having a sodium ions content ranging between 9-39%. In step S12, an operating voltage (such as 1000 volts) is applied to the upper electrode 150 and the lower electrode 110 by a voltage source 160 to perform a PID test on the module-like sample. In step S13, a shunt resistance of the solar cell 120 is measured by a measuring circuit 170 connected between the solar cell 120 and the lower electrode 110. The measuring circuit 170 can be exemplified by a resistance meter or a bridge circuit.

The solar cell testing system and the testing method thereof disclosed in above embodiments of the present disclosure provide a method which accelerates the verification of PID performance. In comparison to the conventional verification method, which needs to verify the entire solar cell module, requires expensive detection equipment, and takes a long testing time, the testing system of the present embodiment requires only simple equipment and can effectively reduce the testing time. Moreover, the testing system of the present embodiment can effectively analyze how different sodium ion contents affect the PID of the cell, and therefore can provide more objective and reliable test data for qualification.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A solar cell testing system, comprising:
   a lower electrode;
   a solar cell disposed on the lower electrode;
   an encapsulation material disposed on the solar cell;
   a sodium-containing template disposed on the encapsulation material, wherein the sodium-containing template has a sodium ion content ranging between 9-39%;
   an upper electrode disposed on the sodium-containing template;
   a voltage source connected between the upper electrode and the lower electrode; and
   a measuring circuit connected between the solar cell and the lower electrode for measuring a shunt resistance of the solar cell.

2. The system according to claim 1, wherein the sodium-containing template contains a compound having different sodium ion contents.

3. The system according to claim 2, wherein the sodium ion content of the sodium-containing template ranges between 9-13%, 13-23% or 23-39%.

4. The system according to claim 1, wherein the sodium-containing template contains a resin material.

5. The system according to claim 4, wherein the resin material is a thermosetting resin.

6. The system according to claim 4, wherein the resin material is a thermoplastic resin.

7. The system according to claim 1, wherein the encapsulation material comprises ethylene vinyl acetate (EVA), silicone material, ethylene/methacrylate, polybutyl acrylate or aliphatic polyurethane.

8. A solar cell testing method, comprising:
   providing a module-like sample to a lower electrode and an upper electrode, wherein the module-like sample comprises a solar cell, a encapsulation material, and a sodium-containing template having a sodium ion content ranging between 9-39%;
   applying an operating voltage to the upper electrode and the lower electrode by a voltage source to perform a potential induced degradation (PID) test on the module-like sample; and
   measuring a shunt resistance of the solar cell by a measuring circuit connected between the solar cell and the lower electrode.

9. The method according to claim 8, wherein the sodium-containing template contains a compound having different sodium ion contents.

10. The method according to claim 8, wherein the sodium-containing template contains a resin material.

11. The system according to claim 1, wherein the sodium ion content of the sodium-containing template ranges between 13-23% or 23-39%.

12. The method according to claim 8, wherein the sodium ion content of the sodium-containing template ranges between 13-23% or 23-39%.

* * * * *